United States Patent
Bode et al.

(10) Patent No.: US 9,507,373 B2
(45) Date of Patent: Nov. 29, 2016

(54) OSCILLATOR CIRCUIT AND METHOD OF GENERATING A CLOCK SIGNAL

(71) Applicants: Hubert Bode, Haar (DE); Dirk Wendel, Grasbrunn (DE)

(72) Inventors: Hubert Bode, Haar (DE); Dirk Wendel, Grasbrunn (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/899,170

(22) PCT Filed: Jul. 4, 2013

(86) PCT No.: PCT/IB2013/055468
§ 371 (c)(1),
(2) Date: Dec. 17, 2015

(87) PCT Pub. No.: WO2015/001388
PCT Pub. Date: Jan. 8, 2015

(65) Prior Publication Data
US 2016/0132070 A1    May 12, 2016

(51) Int. Cl.
G06F 1/04    (2006.01)
G06F 1/08    (2006.01)
H03K 3/0231  (2006.01)
H03K 3/023   (2006.01)

(52) U.S. Cl.
CPC ............... *G06F 1/08* (2013.01); *H03K 3/023* (2013.01); *H03K 3/0231* (2013.01)

(58) Field of Classification Search
CPC .................... G06F 1/08; H03B 5/02
See application file for complete search history.

(56) References Cited

U.S. PATENT DOCUMENTS

| | | | |
|---|---|---|---|
| 6,566,965 B2 | 5/2003 | Kamiya | |
| 7,884,679 B2 | 2/2011 | Mahooti | |
| 2009/0309653 A1 | 12/2009 | Luff | |
| 2010/0237955 A1 | 9/2010 | Mahooti | |
| 2012/0038341 A1 | 2/2012 | Michishita et al. | |
| 2016/0006393 A1* | 1/2016 | Kim .......................... | H03B 5/02 331/108 R |

FOREIGN PATENT DOCUMENTS

| | | |
|---|---|---|
| JP | 05283961 | 10/1993 |
| JP | 06085622 | 3/1994 |
| JP | 2008301042 | 12/2008 |

OTHER PUBLICATIONS

International Search Report and Written Opinion correlating to PCT/IB2013/055468 issued on Apr. 14, 2014.

(Continued)

*Primary Examiner* — Daniel Puentes

(57) ABSTRACT

An oscillator circuit of the type comprising a flip-flop for generating a clock signal and two comparators for comparing a reference voltage with the voltage across a first capacitor which is charged during a first cycle of the clock signal and the voltage across a second capacitor which is charged during a second cycle of a clock signal provides a means for removing the effects of any offset in either comparator. This is achieved by reversing the inputs of the comparators for each cycle of the output frequency. Thus an offset in a comparator which would increase the clock period on one cycle will reduce the period of the next cycle by the same amount. As a net result, the period of time over two clock periods will stay constant regardless of any offset drift in a comparator.

11 Claims, 7 Drawing Sheets

(56) References Cited

OTHER PUBLICATIONS

A Precision Relaxation Oscillator with a Self-Clocked Offset-Cancellation Scheme for Implantable Biomedical SoCs Kumil Choe et al 2009 IEEE International Solid-State Circuits Conference 978-1-4244-3457-2/09.

Intersil, "ICL7650 Chopper-Stabilized Operational Amplifier", Intersil—Component Data Catalog 1986, 1985, pp. 4-50-4-56.

* cited by examiner

PRIOR ART - FIG. 1

OSCILLATOR CIRCUIT AND METHOD OF GENERATING A CLOCK SIGNAL

FIELD OF THE INVENTION

This invention relates to an oscillator circuit and method of generating a clock signal and has particular, though not exclusive application to embedded control systems which require "on chip" clock generation.

BACKGROUND OF THE INVENTION

Embedded control systems often incorporate "on-chip" clock generation and a certain precision and stability of such a clock is required depending on the application. Typically, generation of a clock signal may be achieved using a so called "RC oscillator" or "relaxation oscillator" where the output toggles when a capacitor is charged to a certain threshold. One known RC oscillator circuit is described in US 20100237955 A1. A similar circuit arrangement is illustrated in FIG. 1. Referring to FIG. 1, an oscillator circuit 100 is arranged to provide an output clock signal CLK having a particular frequency. The oscillator circuit 100 comprises a voltage reference Vref, a first current source 101, a first capacitor 102, a first capacitor switch 103, a second current source 104, a second capacitor 105, a second capacitor switch 106, a first comparator 107, a second comparator 108 and a flip-flop 109. The voltage reference Vref is provided from a reference current source 110 and a reference RC circuit 111 in a commonly known manner. The first capacitor 102 is arranged to, by operation of the first capacitor switch 103, be chargeable by the first current source 101 to a first capacitor voltage on a first capacitor node 112 in a first half-phase of the output clock cycle and to be dischargeable in a second half-phase of the output clock cycle. The second capacitor 105 is arranged to, by operation of the second capacitor switch 106, be chargeable by the second current source 104 to a second capacitor voltage on a second capacitor node 113 in the second half-phase of the output clock cycle and to be dischargeable in a first half-phase of the output clock cycle. The first comparator 107 is arranged to provide a first comparator output from continuously comparing the first capacitor voltage to the reference voltage. The second comparator 108 is arranged to provide a second comparator output from continuously comparing the second capacitor voltage to the reference voltage. The flip-flop 109 is connected to both comparators and generates the output clock signal CLK and an inverted output clock signal on its outputs. The flip-flop's CLK output and its inverted output operate the first and second switches respectively. The oscillator frequency can be trimmed to the target frequency by the choice of resistor in the RC circuit 111. Such conventional embedded oscillator circuits can suffer from output frequency long term drift caused by drift in the offset of the comparator(s). While initial frequency offsets may be compensated to some extent by factory trim, the resulting drift may not be low enough to meet certain specifications which may force a system designer to use external oscillators such as a quartz crystal oscillator. Offset is mostly caused by transistor threshold mismatch. The threshold can change over time due to mobile hydrogen (moving in and out the channel region), NBTI (negative bias instability especially on pmos devices), HCI (hot carrier injection) and other effects. Matching transistors can have an initial offset caused by lithography difference or well proximity effects, for example. This causes unwanted clock frequency instability with temperature. Drift effects may be more pronounced on devices with relatively thin oxide layers and it is not possible to trim the drift effects away because they are mostly unforeseeable in direction and magnitude. Furthermore, since the overall magnitude of long-term drift can only be predicted, a guaranteed tolerance in a device's specification is difficult to achieve.

SUMMARY OF THE INVENTION

The present invention provides an oscillator circuit and method of generating a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In one embodiment a method for generating a clock signal in an oscillator circuit comprises applying a varying voltage to one input of a comparator and a reference voltage to another input of the comparator, comparing a varying voltage with a reference voltage, and periodically reversing the inputs to the comparator.

In one embodiment, the output of the comparator may trigger a flip-flop whose output comprises a clock signal. The inputs to a comparator may be reversed (that is to say exchanged) every other output clock cycle or a multiple thereof. In one embodiment, a comparator's inputs are reversed each time the flip-flop is triggered or set or reset.

Thus, an offset in a comparator which would increase the clock period on one cycle will reduce the period of the next cycle by the same amount (due to the fact that any offset drift tends to evolve slowly compared with the output clock frequency). As a net result, the period of time over two clock periods will stay constant regardless of any offset drift. So the oscillator's output clock period (and therefore its frequency) will be stabilised even under offset drift conditions. Thus, an oscillator according to an example embodiment may remove the effects of any offset rather than cancel the offset.

Advantageously, a device which includes the oscillator circuit according to one embodiment may no longer have a requirement for an external crystal.

Further, an oscillator circuit in accordance with one example embodiment may permit the use of comparatively higher speed comparators to allow generation of higher output clock frequencies without the deleterious effects of drift, initial offset or offset being present.

Figure 1:
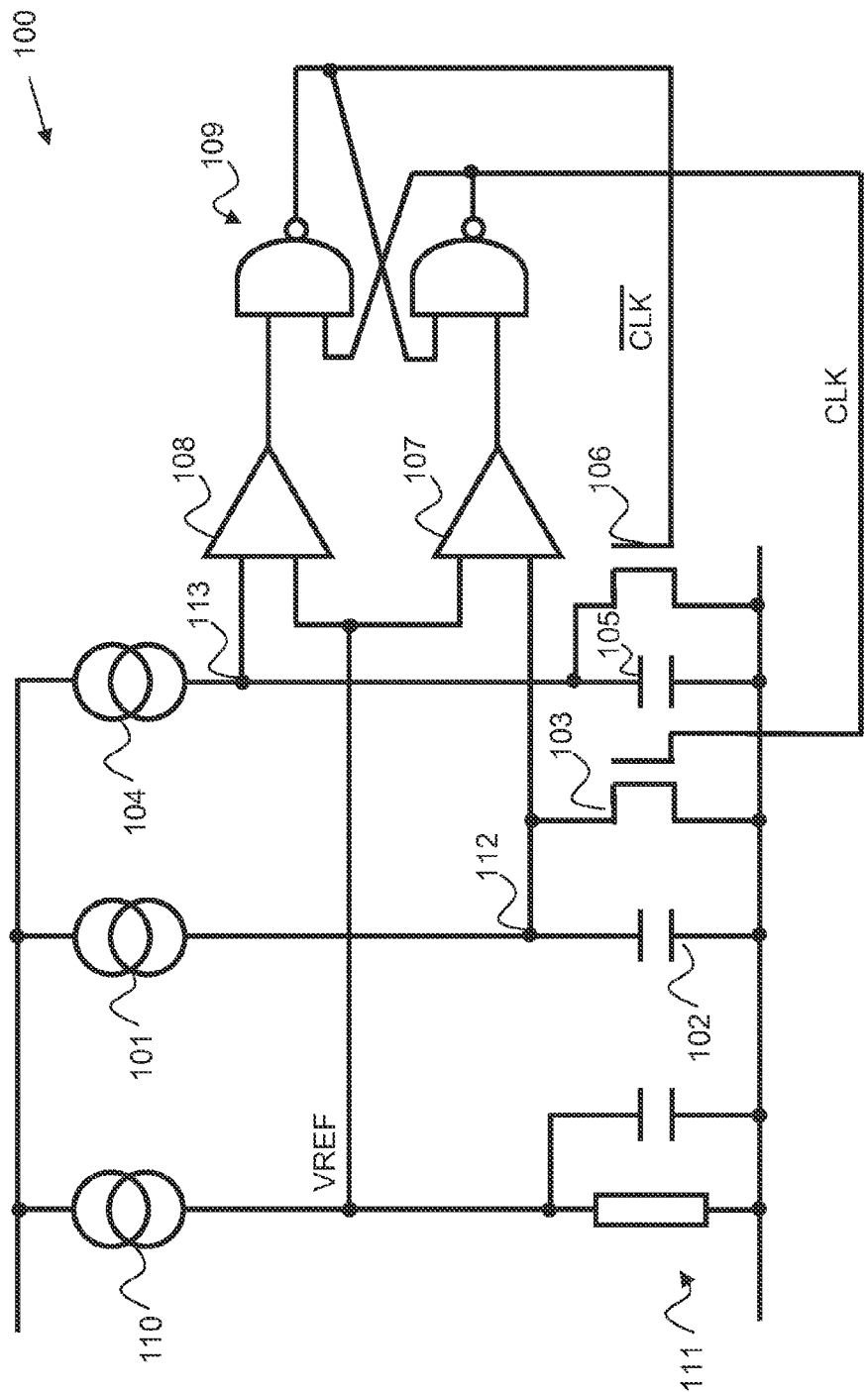
FIG. 1 is a simplified block diagram of a known oscillator circuit.
Figure 2:
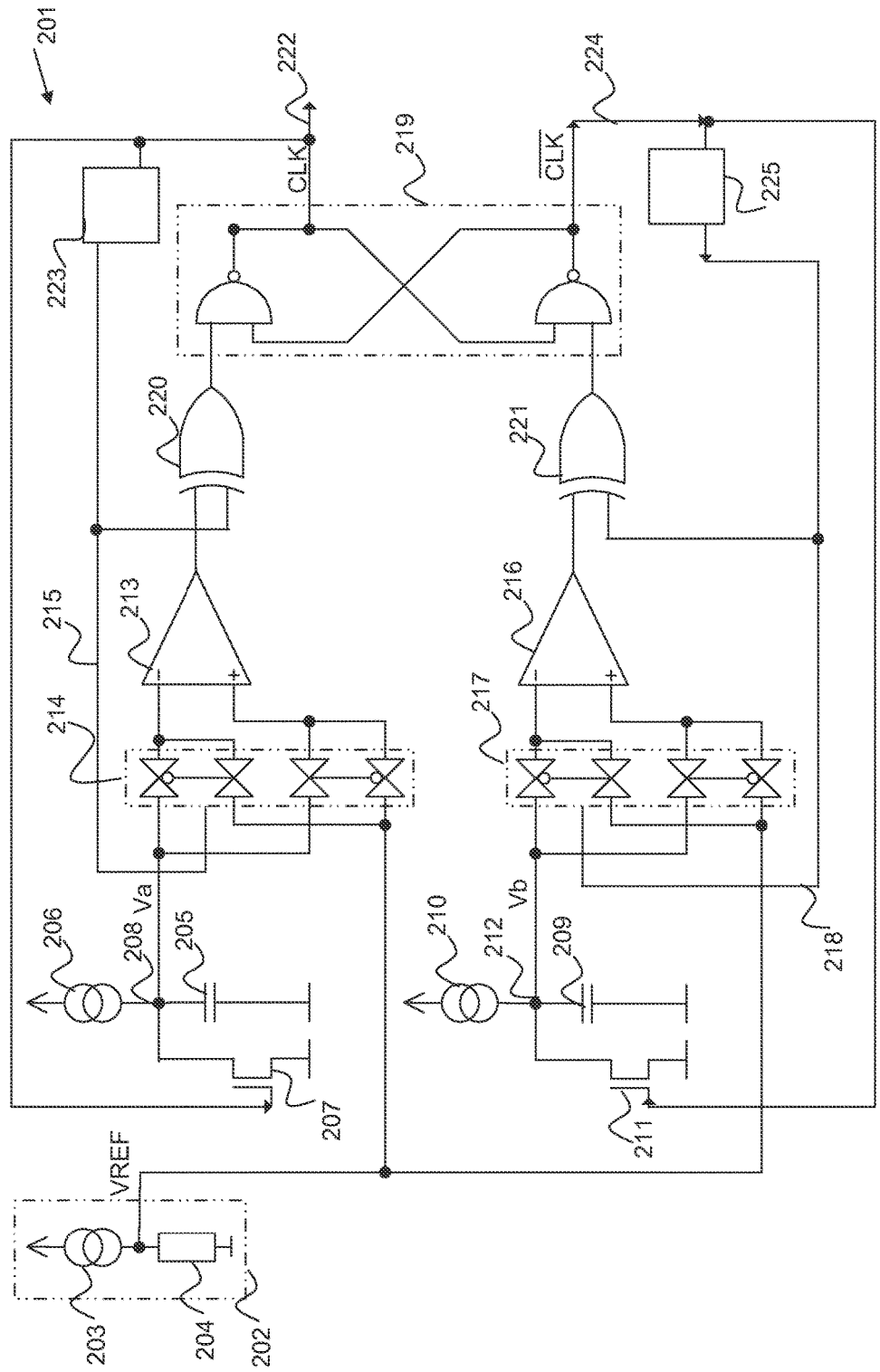
FIG. 2 is a simplified block diagram of a first example of an oscillator circuit.

With reference to FIG. 2, an oscillator circuit 201 may be provided with a reference voltage VREF which may be generated by a voltage source 202 represented in FIG. 2 by a current source 203 and a resistor 204. The voltage source 202 may comprise part of the oscillator circuit 201 or may be external to it. That is to say that the oscillator circuit may include the necessary circuitry for generating a reference voltage or it may receive a reference voltage from an external supply. The oscillator circuit 201 may comprise a first capacitor 205, a first current source 206 and a first switch 207. On activation of the first switch 207 (in this illustrated example, by opening the first switch 207), the first capacitor 205 may be charged by the first current source 206 to a voltage value Va which may appear at a first capacitor node 208. The oscillator circuit 201 may also comprise a second capacitor 209, a second current source 210 and a second switch 211. On activation of the second switch 211 (in this illustrated example by opening the second switch 211), the second capacitor 209 may be charged by the second current source 210 to a voltage value Vb which may appear at a second capacitor node 212.

The first capacitor node 208 may be operably coupled to either one of two inputs of a first comparator 213 depending on operation of a first switching module 214. The first switching module 214 may be controlled by a first switch control signal on line 215.

The second capacitor node 212 may be operably coupled to either one of two inputs of a second comparator 216 depending on operation of a second switching module 217. The second switching module 217 may be controlled by a second switch control signal on line 218.

The first and second switching modules 214, 217 may perform an analog multiplexing function and may comprise any type of appropriate device such as solid-state switches including transistor elements for example. The reference voltage VREF may also be operably coupled to either one of the two inputs of the first and second comparators 213, 216 depending on operation of the first and second switching modules 214, 217 respectively and under the control of the first and second switch control signals on lines 215 and 218 respectively.

An output of the first comparator 213 and an output of the second comparator 216 may be operably coupled to inputs of a flip-flop 219. In one embodiment, the flip-flop may be an RS flip-flop. In this example embodiment, before the outputs of each comparator 213, 216 are received by the flip-flop 219, their polarities may be adjusted by polarity adjustment modules which may be controlled by a signal which changes state every other time an output of the flip-flop 219 changes state. In the illustrated embodiment, polarity adjustment modules may comprise first and second exclusive-or gates 220, 221 which, in turn, may be controlled by the first and second switch control signals on lines 215, 218 respectively.

The application of the various inputs (for example, Va, Vb, and a reference voltage VREF) to the two comparators 213, 216 may be under the control of first and second control devices which are to be described below.

An output clock signal CLK appearing at a first output of the flip-flop 219 on line 222 may be divided by two by a divide-by-two module which in this example may comprise a first flip-flop 223. The first flip-flop 223 may thus generate the first switch control signal (on line 215) whose state changes every other time the state of the flip flop's output on line 222 changes.

An inverted output clock signal appearing at a second output of the flip-flop 219 on line 224 may be divided in two by another divide-by-two module which in this example may comprise a second flip-flop 225. The second flip-flop 225 may thus generate the second switch control signal on line 218 whose state changes every other time the state of the flip flop's inverted output on line 224 changes. It will be appreciated that such a switch control module may be realised by logic gates or elements other than the flip flops illustrated in the example embodiment The comparators 213 and 216 may compare VREF with Va and Vb respectively with the inputs of each comparator being reversed every other comparison step by the action of the first and second switching modules 214, 217 which are under the control of the first and second switch control signals. The first and second switch control signals on lines 215 and 218 respectively may also control the exclusive-or gates 220, 221 ensuring that their outputs always pulse low whenever a comparator trips.

Hence, in one embodiment, the comparators are used with reversed inputs. Control devices, for example the switching modules 214, 217 in conjunction with the first and second flip-flops 223, 225, may reverse the inputs of the first comparator 213 each time the flip-flop 219 is set and reverse the inputs of the second comparator each time the flip-flop 219 is reset In the example of FIG. 2, the first switch 207 may be controlled by the clock output and the second switch 211 may be controlled by the inverse clock output so that both switches change state (but in the opposite direction to one another) whenever the clock output changes state.

Figure 3:
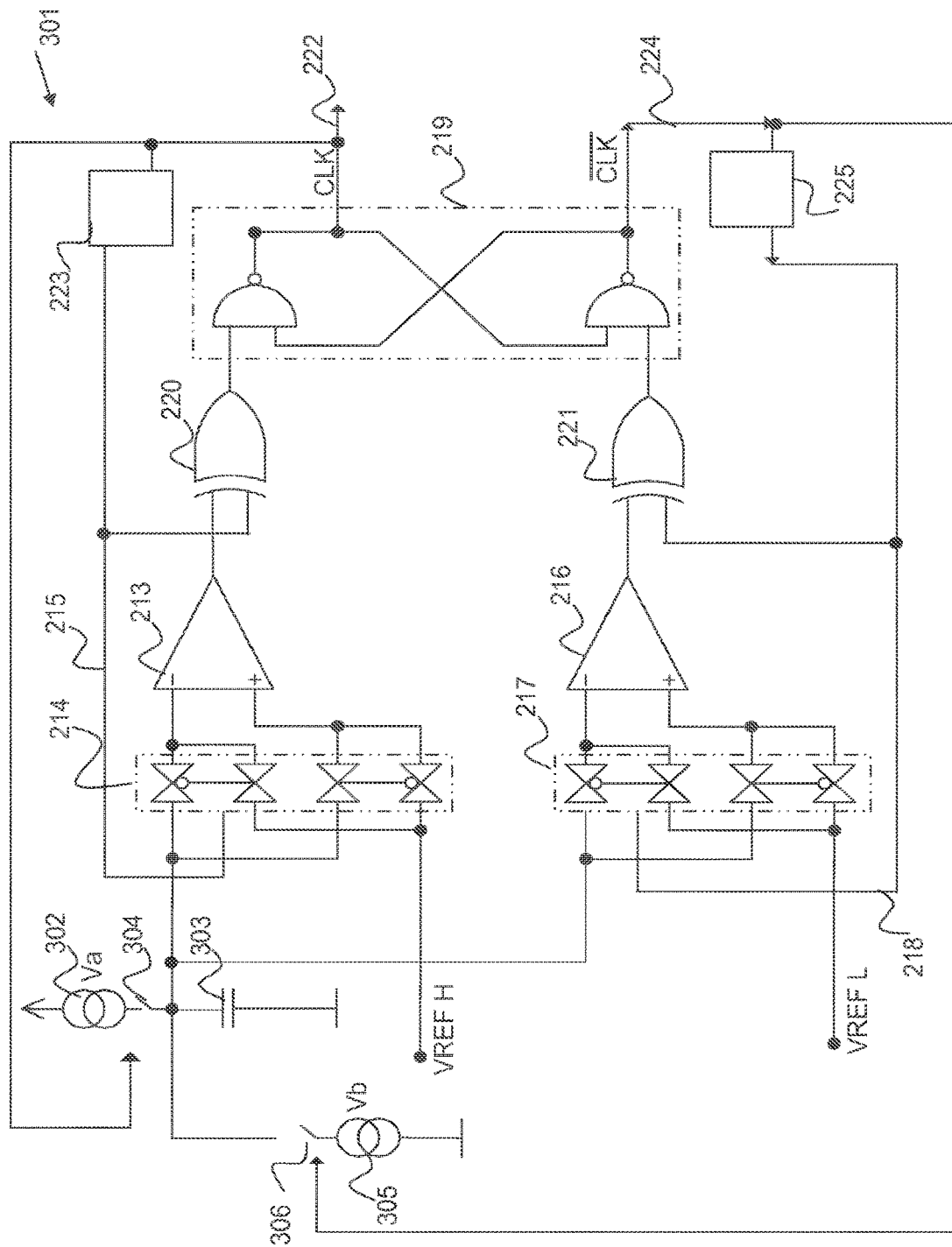
FIG. 3 is a simplified block diagram of a second example of an oscillator circuit.

A second example of an oscillator circuit 301 will now be described with reference to FIG. 3. Circuit components which are common to the oscillator circuit 301 and the oscillator circuit 201 of FIG. 2 bear the same reference numerals. In this second embodiment, a single capacitor is charged up and down between two voltage values and the capacitor voltage is compared with a higher voltage reference VREF H applied to one comparator and a lower voltage reference VREF L applied to another comparator A first current source 302 may be operably coupled to a capacitor 303 by the action of a first switch 304. A second current source 305 may be operably coupled to the capacitor 303 by the action of a second switch 306. The voltage references VREF H and VREF L may be provided by any conventional supply which may form part of the oscillator circuit 301 or may comprise an external device. On activation of the first switch 304 (in this illustrated example, by closing the first switch 304), the capacitor 303 may be charged by the first current source 302 to a higher voltage value. On activation of the second switch 306 (in this illustrated example by closing the second switch 306), the capacitor 303 may be charged by the second current source 305 to a lower voltage value. In the example of FIG. 3, the first switch may be controlled by the clock output such that the switch is closed when the clock output is high (and opened when low). The second switch may be controlled by the inverse clock output such that the second switch is closed when the inverse clock output is high (and opened when low).

The voltage appearing across the capacitor 303 may be operably coupled to either one of two inputs of two comparators 213, 216 depending on operation of first and second switching modules 214, 217. The first switching module 214 may be controlled by a first switch control signal on line 215 and the second switching module 217 may be controlled by a second switch control signal on line 218.

The first and second switching modules 214, 217 may perform an analog multiplexing function and may comprise any type of appropriate device such as solid-state switches including transistor elements for example.

The higher reference voltage VREF H may be operably coupled to either one of the two inputs of the first comparator 213, depending on operation of the first switching modules 214 and under the control of the first switch control signal on lines 215. The lower reference voltage VREF L may be operably coupled to either one of the two inputs of the second comparator 216 depending on operation of the second switching module 217 and under the control of the second switch control signal on line 218.

An output of the first comparator 213 and an output of the second comparator 216 may be operably coupled to inputs of a flip-flop 219. In one embodiment, the flip-flop may be an RS flip-flop. In this example embodiment, before the outputs of each comparator 213, 216 are received by the flip-flop 219, their polarities may be adjusted by polarity adjustment modules 220, 221 which may be controlled by a signal which changes state every other time an output of the flip-flop 219 changes state. In the illustrated embodiment, polarity adjustment modules may comprise first and second exclusive-or gates 220, 221 which, in turn, may be controlled by the first and second switch control signals on lines 215, 218 respectively.

The application of the various inputs to the two comparators 213, 216 may be under the control of first and second control devices which are to be described below.

An output clock signal CLK appearing at a first output of the flip-flop 219 on line 222 may be divided by two by a divide-by-two module which in this example may comprise a first flip-flop 223. The first flip-flop 223 may thus generate the first switch control signal (on line 215) whose state changes every other time the state of the flip flop's output on line 222 changes.

An inverted output clock signal appearing at a second output of the flip-flop 219 on line 224 may be divided in two by another divide-by-two module which in this example may comprise a second flip-flop 225. The second flip-flop 225 may thus generate the second switch control signal on line 218 whose state changes every other time the state of the flip flop's inverted output on line 224 changes. It will be appreciated that such a switch control module may be realised by logic gates or elements other than the flip flops illustrated in the example embodiment The first comparator 213 compares the capacitor voltage with VREF H and the second comparator 216 compares the capacitor voltage with VREF L and the inputs of each comparator are reversed every other comparison step by the action of the first and second switching modules 214, 217 which are under the control of the first and second switch control signals. The first and second switch control signals on lines 215 and 218 respectively may also control the exclusive-or gates 220, 221 ensuring that their outputs always pulse low whenever a comparator trips.

Hence, in the embodiment of FIG. 3, the comparators may be used with reversed inputs. Control devices, for example the switching modules 214, 217 in conjunction with the first and second flip-flops 223, 225, may reverse the inputs of the first comparator 213 each time the flip-flop 219 is set and reverse the inputs of the second comparator each time the flip-flop 219 is reset As comparator offset drift, typically is not necessarily random, but more often caused by different Vgs (gate to source voltage of constituent transistors) over time or different Ids (drain to source current) vs Vds (drain to source voltage) over time, the oscillator circuit according to some embodiments has the benefit that the stress on the constituent devices is averaged out since it is always used the opposite way for every other cycle.

In typical use cases of an oscillator circuit according to one example embodiment, the output clock frequency may be divided by two before it is used as a reference clock signal by any subsequent circuitry, thus yielding a consistent time period between rising edges. For example this divided by two signal may be taken from either of the first or second flip-flops 223, 225.

Figure 4:
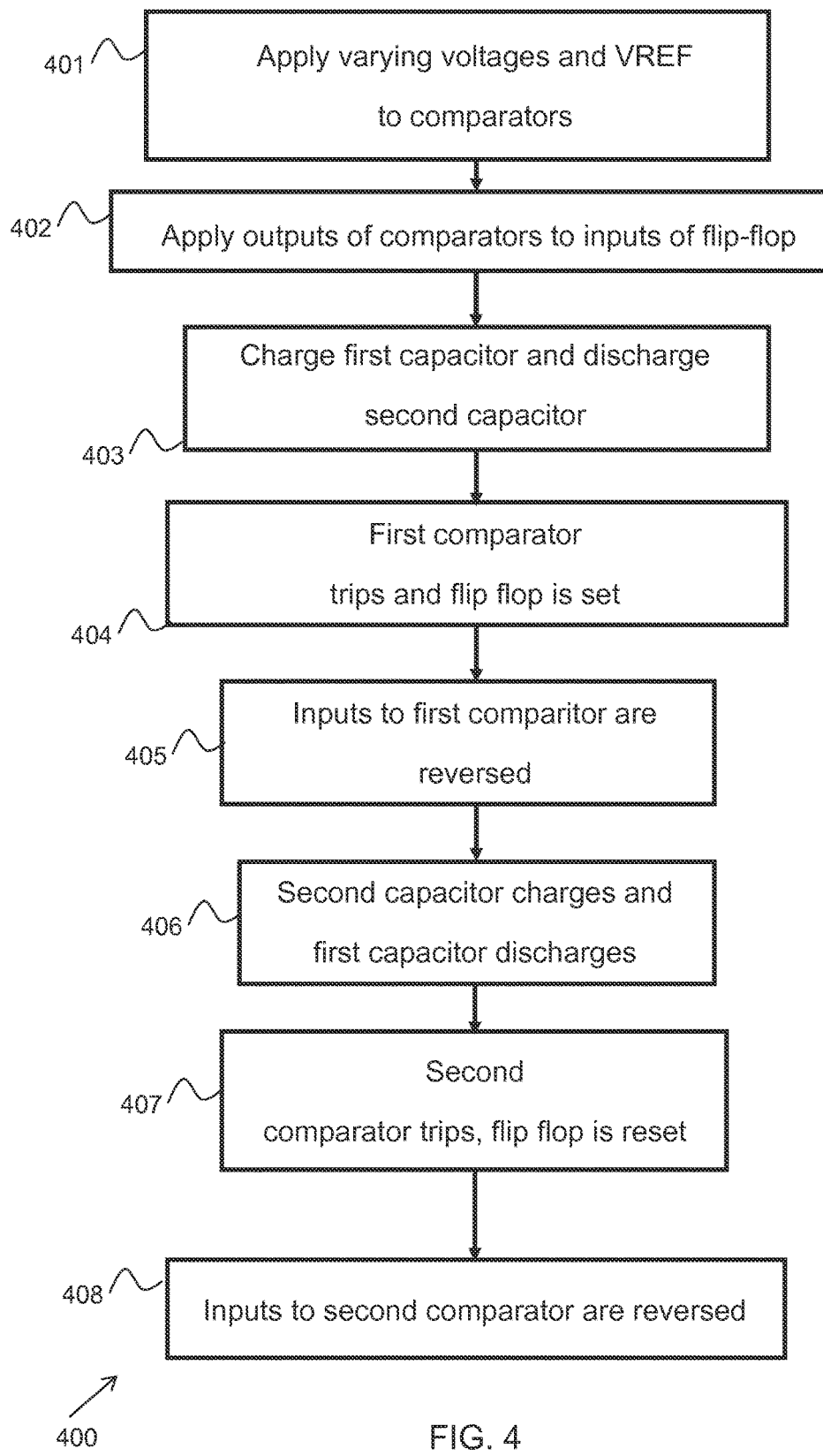
FIG. 4 is a simplified flowchart illustrating a first example of a method of generating a clock signal.

A first example of a method 400 for generating a clock signal which method may employ the oscillator circuit 201 of FIG. 2 will now be described with reference to FIG. 2 and to the flowchart of FIG. 4.

At 401, a varying voltage Va may be applied to the first input of the first comparator 213 and a reference voltage VREF may be applied to the second input of the first comparator. Also a varying voltage Vb may be applied to the first input of the second comparator 216 and the reference voltage VREF may be applied to the second input of the second comparator.

At 402, the outputs of each comparator 213, 216 may be applied to the inputs of the flip-flop 219 and in this example may be applied to the flip-flop's inputs via one of two exclusive or gates 220, 221.

At 403, during a first half cycle of the output clock, the first switch 207 may be opened and the second switch 211 may be closed, thereby enabling the first capacitor 205 to charge up through the first current source 206 and the second capacitor 209 to discharge.

At 404, the voltage across the first capacitor may reach a value which causes the first comparator 213 to trip which in turn, may set the flip-flop 219 and so set the output clock signal on line 222.

A second half cycle of the output clock may commence at this point and also at the clock set event, the control signal on line 215 to the first switching module 214 may toggle thereby causing the switching module 214 to reverse the inputs of the first comparator, at 405. That is to say that for the subsequent comparison step between Va and VREF, VREF is applied to the first input of the first comparator 213 and the varying voltage signal Va is applied to the second input of the first comparator 213.

During a second-half cycle of the output clock at 406, the first switch 207 may be closed and the second switch 211 may be opened thereby enabling the second capacitor 209 to charge up and the first capacitor 205 to discharge.

At 407, if the voltage across the second capacitor reaches a value which causes the second comparator 216 to trip, then the flip-flop 219 may be reset, thereby resetting the output clock signal on line 222.

With the clock reset event, the switch control signal on line 218 may toggle and cause the second switching module 217 to reverse the inputs of the second comparator 216, at 408. That is to say that for the subsequent comparison step between Vb and VREF, VREF is applied to the first input of the second comparator 216 and the varying voltage signal Vb is applied to the second input of the second comparator 216.

The method may revert to 403 and comparison processes may repeat with the comparator inputs being reversed every other clock cycle.

The setting and resetting of the flip-flop 219 provides an oscillator output clock signal.

It will be noted that the control of the reversal of the comparator inputs by the control signals on lines 215 and 218 also ensures that the inputs of a comparator are switched over at a point in time when that comparator is not actively being used to make a comparison between a capacitor voltage and a reference voltage (since the other comparator is making a comparison at this time). The reversed inputs have a chance to settle before a subsequent comparison cycle starts.

At 404 and 407, each comparator output may be modified by the action of an exclusive or gate 220, 221. For example, the first exclusive or gate 220 receives the output from the first comparator 213 and the first switch control signal on line 215 which may generated by the first flip-flop 223. The second exclusive or gate 221 receives the output from the second comparator 216 and the second switch control signal on line 218 which may be generated by the second flip-flop 225. The signals on control lines 215 and 218 may change state every other time the flip-flop output state changes. The action of the exclusive or gates ensures that the flip-flop 219 receives the correct triggering signal whenever either comparator trips, thereby enabling flip-flop 219 to generate the output clock signal and its inverse.

Figure 5:
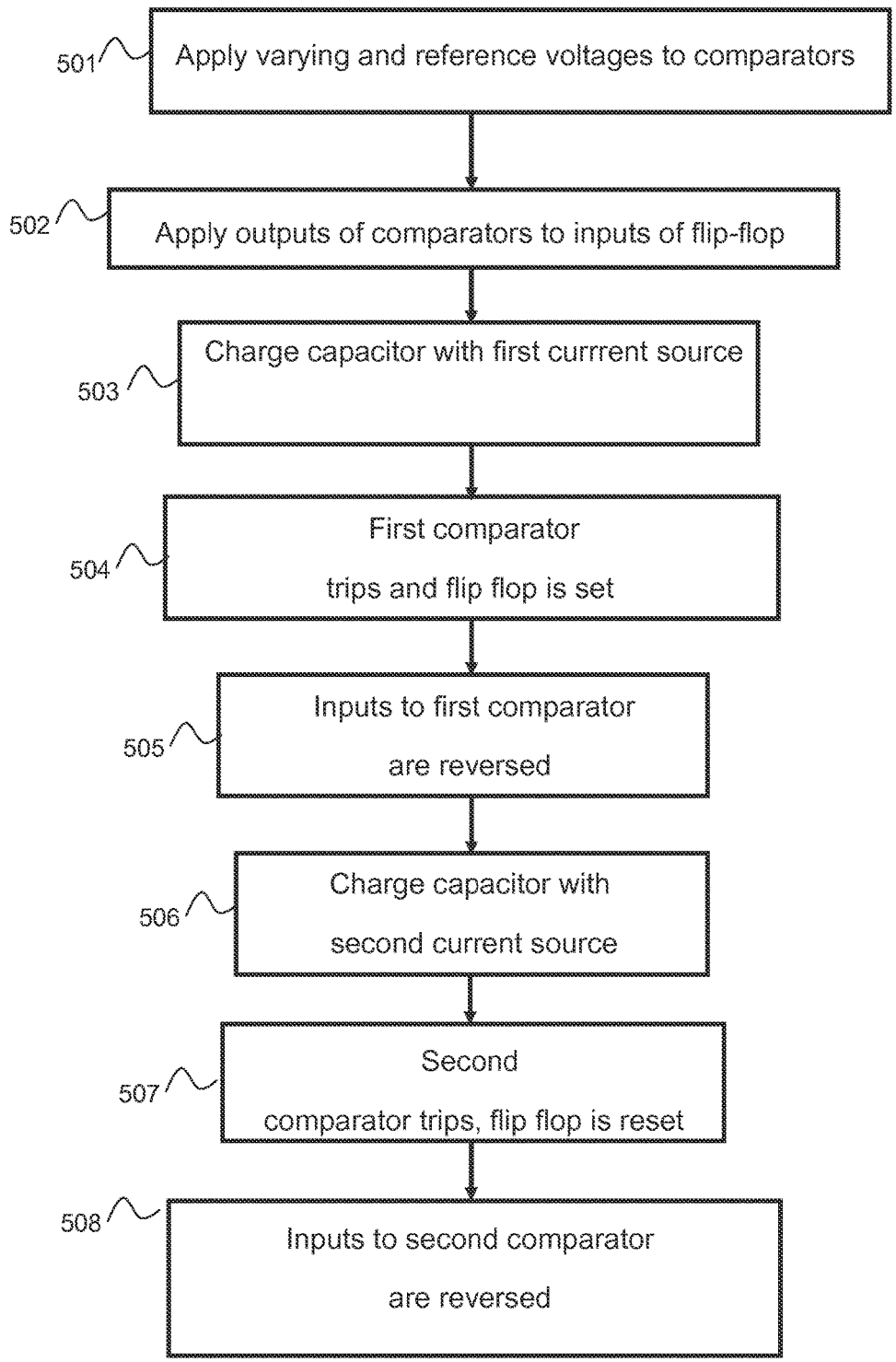
FIG. 5 is a simplified flowchart illustrating a second example of a method of generating a clock signal.

A second example of a method 500 for generating a clock signal which method may employ the oscillator circuit 301 of FIG. 3 will now be described with reference to FIG. 3 and to the flowchart of FIG. 5.

At 501, a varying voltage may be applied to the first inputs of the first and second comparators 213, 216 and a higher reference voltage VREF H may be applied to the second input of the first comparator 213 and a lower reference voltage VREF L may be applied to the second input of the second comparator 216.

At 502, the outputs of each comparator 213, 216 may be applied to the inputs of the flip-flop 219 and in this example may be applied to the flip-flop's inputs via one of two exclusive or gates 220, 221.

At 503, the first switch 304 may be closed thereby enabling the first current source 302 to charge the capacitor 303 up to a higher voltage level.

At 504, the voltage across the capacitor may cause the first comparator 213 to trip and consequently set the flip-flop 219 and so set the output clock signal on line 222.

A second half cycle of the output clock may commence at this point and also at the clock set event, the control signal on line 215 to the first switching module 214 may toggle thereby causing the switching module 214 to reverse the inputs of the first comparator, at 405. That is to say that for the subsequent comparison step between the capacitor voltage and VREFH, VREF H is applied to the first input of the first comparator 213 and the varying voltage across the capacitor is applied to the second input of the first comparator 213.

During a second-half cycle of the output clock at 506, the first switch 304 may be opened and the second switch 306 may be closed thereby enabling the second current source 305 to charge the capacitor 303 to a lower voltage level.

At 507, the voltage across the capacitor may cause the second comparator 216 to trip which in turn, may reset the flip-flop 219 and so reset the output clock signal on line 222.

With the clock reset event, the switch control signal on line 218 may toggle and cause the second switching module 217 to reverse the inputs of the second comparator 216, at 508. That is to say that for the subsequent comparison step between the capacitor voltage and VREF L, VREF L is applied to the first input of the second comparator 216 and the varying voltage signal appearing across the capacitor is applied to the second input of the second comparator 216.

The method may revert to 503 and comparison processes may repeat with the comparator inputs being reversed every other clock cycle.

The setting and resetting of the flip-flop 219 provides an oscillator output clock signal.

At 504 and 507, each comparator output may be modified by the action of an exclusive or gate 220, 221. For example, the first exclusive or gate 220 receives the output from the first comparator 213 and the first switch control signal on line 215 which may generated by the first flip-flop 223. The second exclusive or gate 221 receives the output from the second comparator 216 and the second switch control signal on line 218 which may be generated by the second flip-flop 225. The signals on control lines 215 and 218 may change state every other time the flip-flop output state changes. The action of the exclusive or gates ensures that the flip-flop 219 receives the correct triggering signal whenever a comparator trips, thereby enabling flip-flop 219 to generate the output clock signal and its inverse.

Figure 6:
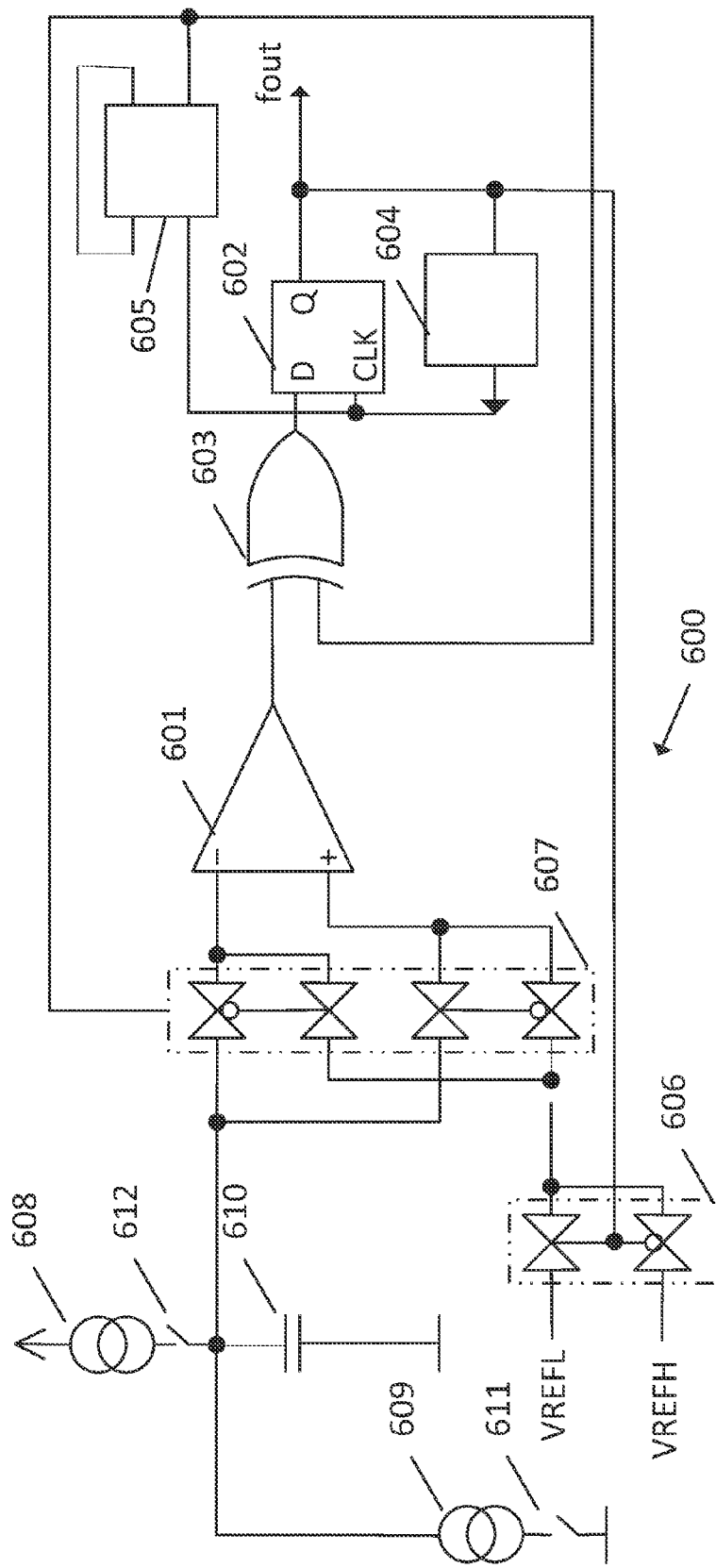
FIG. 6 is a simplified block diagram of a third example of an oscillator circuit.

Referring now to FIG. 6, an oscillator circuit 600 may comprise a comparator 601 whose output may be operably coupled to a first input of a flip-flop 602 via an exclusive-or gate 603. The flip-flop 602 may be a D-type transparent latch. In one embodiment, it may be arranged to be transparent when its clock input is low. An output of the transparent latch 602 may be operably coupled to an input of a monoflop (monostable multi-vibrator) 604 and to a voltage reference control switch arrangement 606. An output of the monoflop 604 may be operably coupled to a second input of the transparent latch 602 and to an input of a divide-by-two module 605. In one embodiment, the divide-by-two module 605 may comprise a second flip-flop. An output of the divide-by-two module 605 may be operably coupled to a switching module 607 and to an input of the exclusive-or gate 603, Outputs of the switching module 607 may be operably coupled to first and second inputs of the comparator 601. First and second current sources 608, 609 may provide charging current to a charging capacitor 610 under the control of one or another of two current source switches 611, 612 which in turn may be opened and closed by an output signal provided by the transparent latch 602. A lower reference voltage VREF L and a higher reference voltage VREF H may be applied to one or the other of the inputs of the comparator 601, according to the operation of the switching module 607 and compared with a voltage appearing across the capacitor 610 which may be applied to another input of the comparator 601. For example, one of the two current source switches 612 may be arranged to be conducting when the output of the flip-flop 602 is at a logical "0" and the other of the two current source switches 611 may be arranged to be conducting when the output of the flip-flop 602 is at a logical "1."

Figure 7:
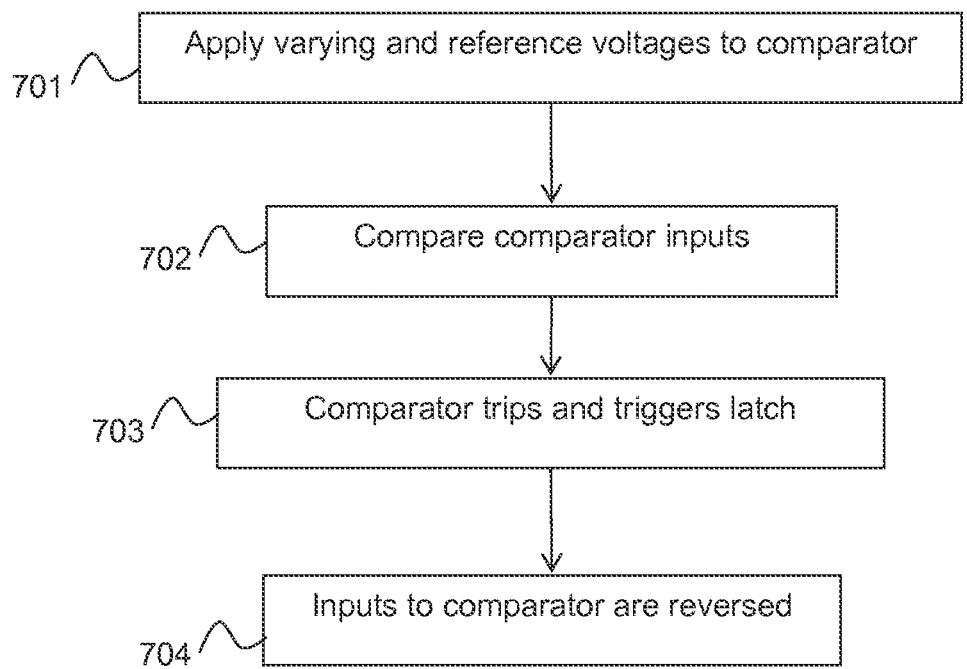
FIG. 7 is a simplified flowchart illustrating a third example of a method of generating a clock signal.

A method of operating a third example embodiment of an oscillator circuit will now be described with reference to FIG. 6 and to the flowchart 700 of FIG. 7.

At 701, a varying voltage is applied to one input of the comparator 601 and a reference voltage is applied to the other input of the comparator 601 for comparison. In this third example embodiment, a single capacitor may be charged up towards a higher reference voltage VREF H and then charged down again towards a lower reference voltage VREF L and so on. At 702, the inputs to the comparator 601 may be compared and when the comparator trips, its output may trigger (at 703) the transparent latch 602 which may, in turn, generate an output signal fout. Periodically, at 704, the inputs to the comparator 601 may be reversed. The exclusive-or gate 603 may ensure that the polarity of the output of a signal from the comparator 601 has the correct polarity for feeding into the transparent latch 602.

The output fout of the transparent latch needs to be frozen for a certain time period while a reversal of the comparators inputs and a polarity compensation of the comparators output takes place otherwise fout would spike, which is undesirable. This may be accomplished by virtue of the transparent latch 602 and the monoflop 604 (see FIG. 6). A rising edge of the signal fout may trigger the monoflop 604. The monoflop 604 may have a pulse length which is set to be higher than the settling time of the comparator 601 (once its inputs have been reversed) but shorter than a half cycle of fout. This pulse length may vary between these two limits without having any deleterious effect on the oscillator circuit 600. While the monoflop 604 is running, after having received the rising edge on its input, the fout signal is frozen because the transparent latch 603 will move to a storage state. With the monoflop 604 being triggered, the divide-by-two module 605 may be toggled, therefore causing a change of state in its output. This change of state of the divide-by-two module's output may trigger the switching module 607 so that the inputs to the comparator 601 will be revered. The output signal of the divide-by-two module 605 will also set the exclusive-or gate 603 so that the polarity of the output of the comparator is set correctly. The comparator 601 will settle again before the monoflop runs out (it may return to the same output state that it had before toggling) and finally the transparent latch 603 will become transparent again when the monoflop 604 has run out. Further, fout will change again once the comparator trips again. It will be understood that the pulse length of the monoflop's output must be long enough to overcome any of the offset error which may be present in the comparator 601 because the comparator's output (after being "exclusively-ored") must provide the same polarity as before the inputs had been reversed. Since any offset effect is reversed by reversing the inputs of the comparator 601, the capacitor may, preferably, be already charged to a voltage value which is at least twice any offset.

The invention may, at least in part, also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks and circuit elements are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example the exclusive-or function provided by either or both of the exclusive-or gates 220, 221 may be realised by any one of several alternative conventional logic gate combinations. Further, the generation of the switching control signals on lines 215 and 218 may be performed by any appropriate logic gate or combination of gates or circuits and is not limited to the use of the flip flops as described in the examples given.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the circuit elements comprising the oscillator circuit of FIG. 2, 3 or 6 may be implemented in an integrated circuit. Such an integrated circuit may also include a reference voltage source. An integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bondwires between the pins and the dies. The oscillator circuit of FIG. 2, 3 or 6 may be incorporated in any other logical device such as a microcontroller for example.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention clamed is:

1. An oscillator circuit for providing a clock signal, the oscillator circuit comprising:
   a comparator;
   a varying voltage source and a voltage reference arranged to carry a reference voltage for connection to first and second inputs of the comparator respectively, wherein the comparator is arranged to compare a varying voltage source with a reference voltage; and
   a control device arranged to periodically reverse the inputs to the comparator.

2. The oscillator circuit of claim 1 for providing a clock signal, the oscillator circuit comprising:
   first and second comparators;
   a first varying voltage source and a first voltage reference arranged to carry a first reference voltage for connection to first and second inputs respectively of the first comparator;
   a second varying voltage source and a second voltage reference arranged to carry a second reference voltage for connection to first and second inputs respectively of the second comparator, wherein each comparator is arranged to provide first and second comparator signals respectively from comparing a varying voltage with a reference voltage;
a flip-flop arranged to set an output thereof in response to a signal from the first comparator and to reset said output in response to a signal from the second comparator, thereby producing a clock signal at said output of the flip-flop;
a first control device arranged to reverse the inputs of the first comparator when the flip-flop is set; and
a second control device for reversing the inputs of the second comparator when the flip-flop is reset.

3. The oscillator circuit of claim 2, wherein
the first and second reference voltages are equal,
the first varying voltage source comprises a first current source, a first capacitor and a first switch,
the second varying voltage source comprises a second current source, a second capacitor and a second switch,
said first switch being arranged to enable charging of the first capacitor by the first current source while the output of the flip-flop is at a first logic level and discharging of the first capacitor while the output of the flip-flop is at a second logic level which is the inverse of the first logic level, and
said second switch is arranged to enable charging of the second capacitor by the second current source while the output of the flip-flop is at a second logic level which is the inverse of the first logic level and discharging of the second capacitor while the output of the flip-flop is at the first logic level.

4. The oscillator circuit of claim 2, wherein
the first and second reference voltages have different values,
the first varying voltage source comprises a first current source, a capacitor and a first switch and the second varying current source comprises a second current source, said capacitor and a second switch, and
the first switch is arranged to enable charging of the capacitor by the first current source while the output of the flip-flop is at a first logic level and the second switch is arranged to permit charging of the capacitor by the second current source while the output of flip-flop is at a second logic level which is the inverse of the first logic level.

5. The oscillator circuit of claim 1 wherein
the first control device comprises a first divide-by-two module and a first switching module wherein the first divide-by-two module has an input operably coupled to the output of the flip-flop and an output operably coupled to the first switching module, the first switching module being arranged to reverse the inputs to the first comparator whenever the output from the first divide-by-two module changes state, and
the second control device comprises a second divide-by-two module and a second switching module wherein the second divide-by-two module has an input operably coupled to an inverse output of the flip-flop and an output operably coupled to the second switching module, the second switching module being arranged to reverse the inputs to the second comparator whenever the output from the second divide-by-two module changes state.

6. The oscillator circuit of claim 5 wherein the first and second divide-by-two modules comprise first and second flip-flops.

7. The oscillator circuit of claim 1 and comprising a polarity adjustment module operably coupled between an output of the comparator and the flip-flop and arranged to adjust the polarity of an output of the comparator.

8. The oscillator circuit of claim 7 wherein a polarity adjustment module comprises an exclusive-or gate having a first input operably coupled to a comparator and a second input operably coupled to a control signal whose state changes every other time the flip flop's output state changes.

9. The oscillator circuit of claim 1 wherein the oscillator circuit is implemented in an integrated circuit.

10. A method for generating a clock signal in an oscillator circuit comprising a comparator, the method comprising:
applying a varying voltage to one input of the comparator and a reference voltage to another input of the comparator;
comparing a varying voltage with a reference voltage; and
periodically reversing the inputs to the comparator.

11. The method of claim 10 for generating a clock signal in an oscillator circuit comprising first and second comparators and a flip-flop, the method comprising:
applying a varying voltage and a reference voltage to first and second inputs respectively of each of the first and second comparators;
applying an output of each of the first and second comparators to the flip-flop, in each first and second comparator;
comparing a varying voltage with a reference voltage to produce first and second comparator signals respectively; and
in the flip-flop, setting an output thereof in response to a first comparator signal and resetting said output in response to a second comparator signal, thereby producing a clock signal at an output of the flip-flop, and reversing the inputs of the first comparator when the flip-flop is set, and reversing the inputs of the second comparator when the flip-flop is reset.

* * * * *